TRANSISTOR REACTANCE CIRCUIT

Filed May 3, 1954

INVENTOR.
HUNTER C. GOODRICH

BY H. C. Newton

ATTORNEY

United States Patent Office 2,870,421
Patented Jan. 20, 1959

2,870,421

TRANSISTOR REACTANCE CIRCUIT

Hunter C. Goodrich, Collingswood, N. J., assignor to Radio Corporation of America, a corporation of Delaware Application May 3, 1954, Serial No. 427,165

8 Claims. (Cl. 333—80)

This invention relates generally to variable reactance electrical circuits and particularly relates to a variable reactance circuit in which a semiconductor device or transistor is utilized.

In the past, variable reactance circuits have been found to be useful for many applications in which a change in the resonant frequency of a tuned circuit is to be controlled by the application of a D.-C. or low frequency A.-C. control signal. Basically, a reactance circuit is a two terminal network in which ordinary reactive elements are combined with an active generator which is controlled by the control signal. The reactance which is seen looking into the two terminals will then vary in accordance with this control signal.

If the variable reactance is utilized as one of the reactive elements in an oscillation generator circuit, the frequency of oscillation may be changed by the application of a modulating or control signal. Thus, frequency modulation may be performed by utilization of a variable reactance circuit.

The ability of a reactance circuit to change the frequency of an oscillation generator may be utilized to provide automatic frequency control for that oscillator, particularly in cases where the frequency of the oscillator generator must conform to a predetermined standard frequency as generated by a reference frequency oscillator. An example of this will be found in a frequency modulation receiving system in which the local oscillator must oscillate at a frequency which is at a predetermined frequency difference with the incoming signal. In this case, direct current signal output from an FM discriminator is used as the control signal for a variable reactance circuit which is associated with the local oscillator.

Electron discharge devices have been used in the past in variable reactance circuits to fulfill the aforementioned and other functions. If semiconductor devices or transistors are used in place of electron discharge devices, several advantages accrue, including higher efficiency of operation due to both high output circuit efficiency and to the fact that no heater power is required.

Transistors have been used in the past to provide variable reactance circuits. A United States Patent 2,570,938 issued to Goodrich on October 9, 1951, entitled "Variable Reactance Transistor Circuit" discloses a reactance cirsuit which uses a semiconductor device for transistor. In this circuit, use is made of the fact that the collector current of a transistor may lag with respect to the emitter current. Such a lagging collector current causes the impedance looking into the collector and base electrodes to be reactive. This impedance may be adjusted or varied by adjusting or varying either the collector or emitter bias voltage. This variable reactance may be utilized as an element of a tuned circuit so that variation in the reactance will cause the resonant frequency of the tuned circuit to change in accordance with a control voltage applied to the collector or emitter electrodes. To provide this variable reactance use is made of the transit time of charge carriers flowing between the emitter or collector. Since this variable reactance depends upon transit time of the charge carriers it will work best at comparatively high frequencies and the reactance change which is obtainable will be relatively small.

An improved reactance circuit is shown in another United States Patent 2,570,939 issued to Goodrich on October 9, 1951 entitled "Semiconductor Reactance Circuit." This patent describes a network in which a reactive element is coupled between the emitter and collector electrodes of a transistor, thereby causing the emitter current to be approximately in phase quadrature with the voltage across the reactive element. The resulting reactive current may be controlled by a control voltage applied between the base and emitter electrodes. The network provides a variable reactive impedance which may be connected in parallel with a reactive element of opposite characteristics to provide a resonant circuit whose resonant frequency may be controlled by variation of the control voltage.

The amount of frequency change which may be provided by either of the two aforementioned circuits is limited by the amount of quadrature current drawn by the semiconductor device which in turn is limited by the Q required of the reactance circuit. In addition, variation in gain of the transistor will cause a change in the quadrature current so that interchangeability of transistors in these circuits will be low.

Accordingly it is the primary object of this invention to provide an improved variable reactance circuit embodying a semiconductor device.

It is a further object of the present invention to provide an improved semiconductor variable reactance circuit in which transistors are readily interchangeable.

It is a still further object of this invention to provide a resonant circuit whose frequency of resonance is controllable over a broad frequency range by the application of a control signal.

I is another object of the present invention to provide an improved semiconductor variable reactance circuit which may be used to control or to modulate the frequency of an oscillator generator.

In accordance with the present invention, a two terminal network having the characteristics of a parallel tuned circuit has a first reactive element connected between the two terminals. Also connected between the two terminals is the series combination of the output circuit of a transistor and a second reactive element of opposite type to the first reactive element. A capacitor couples the base electrode of the transistor to the junction of the aforementioned reactive elements at signal frequencies.

Energizing currents are applied between the collector and emitter electrodes of the transistor to bias the collector in a reverse direction relative to the base electrode. Variable direct current bias is applied to the base electrode of the transistor in order to vary the gain. A signal voltage is generated between the collector and emitter electrodes of the transistor which voltage is therefore in series with the second reactive element. This voltage is either in phase or out of phase with the voltage across the two terminals of the circuit, depending upon whether the emitter or collector electrode is connected to the second reactive element. This voltage will change the reactive current flowing through the second reactive element thereby causing the resonant frequency of the combination to change.

If, for example, the emitter electrode is connected to the second reactive element, which may be an inductor, then the voltage which is induced in the transistor will tend to lower the resonant frequency. If, on the other hand, the collector electrode of the transistor is connected to the inductor, the voltage across the inductor will be increased, thereby increasing the reactive current through the inductor causing the resonant frequency to be raised.

The novel features that are considered characteristic of this invention are set forth with particularity in the appended claims. The invention itself, however, both as to its organization and method of operation as well as additional objects and advantages, thereof, will be best understood from the following description when read in connection with the accompanying drawing in which:

Figure 1:
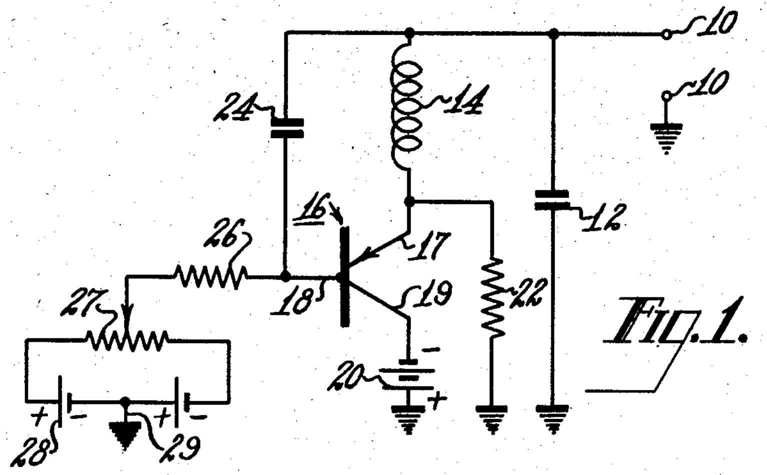
Figure 1 is a schematic circuit diagram of a resonant tuned circuit illustrating one embodiment of a variable reactance circuit of the present invention.

Referring now to the drawing, wherein like elements are designated by like reference numerals through the various figures and referring particularly to Figure 1, a pair of terminals 10 is connected to a first reactive element illustrated as a capacitor 12. In parallel with the capacitor 12 is connected the series combination of a second reactive element 14 and a network including transistor 16 having an emitter electrode 17, a base electrode 18 and a collector electrode 19.

A source of energizing potential, represented as a battery 20, has a negative terminal connected to the collector electrode 19 and a positive terminal connected to a point of substantially fixed reference potential or ground. The direct current path for energizing currents is completed through a load resistor 22 which is connected between the emitter electrode 17 and ground. The emitter electrode 17 is connected to the inductor 14. Signals from any convenient source are applied to the pair of terminals 10 and coupled to the base electrode 18 through a coupling capacitor 24.

Variable bias current is applied to the base electrode 18 through an isolating resistor 26 which is connected to a tap on a variable resistance divider 27, the ends of which are connected to the positive and negative terminals of a tapped source of potential represented by a battery 28. The tap 29 is connected to ground.

If the base current from the aforementioned bias network is varied, the voltage gain between the base and emitter electrodes 18 and 17 will likewise vary. It is noted that the voltage gain between the base and emitter electrodes must be less than unity. The A.-C. signal voltage which is generated between the emitter electrode 17 and ground will therefore be substantially in phase with and somewhat smaller in magnitude than the voltage applied at the pair of terminals 10.

The reactive current flowing through the inductor 14 will therefore be proportional to the difference between the applied voltage and the generated voltage. At resonance, the reactive currents flowing through the inductor 14 and through the capacitor 12 must be equal and opposite. With a relatively high voltage generated by the transistor, the reactive current through the inductor 14 will tend to be small. The resonant frequency is thereby reduced until the inductive current again becomes equal to the capacitive current.

If the bias current to the base electrode 18 is reduced, thereby reducing the current flowing into the emitter electrode 17, the voltage gain will be reduced and the reactive current flowing through the inductor 14 will be relatively increased. The resonant frequency will therefore rise. Control of the resonant frequency of the tuned circuit is thereby effected by a change in the base current. The dynamic impedance between the emitter electrode 17 and ground is relatively low, provided that the impedance to ground in the network connected with the base electrode 18 is not excessively high. This impedance is further lowered by the load resistor 22, which may be chosen as a separate design parameter. Thus, the Q of this circuit may be made high by utilization of a low value of resistance for the resistor 22. The range of frequencies over which the circuit may be tuned will be limited, however, as the value of the resistor 22 is reduced.

Figure 2:
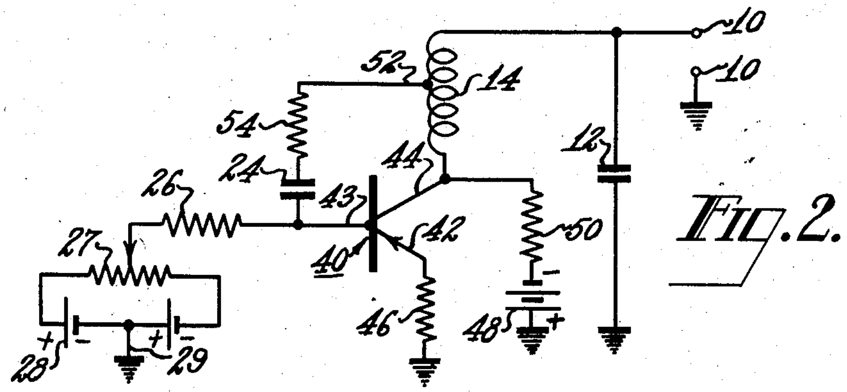
Figure 2 is a schematic circuit diagram of a resonant tuned circuit illustrating another embodiment of the variable reactance circuit of the present invention.

In Figure 2, to which reference is now made, a resonant circuit coupled to a pair of terminals 10 comprises a first reactive element illustrated as a capacitor 12, and the series combination of a second reactive element illustrated as an inductor 14 and a transistor network as in the circuit of Figure 1. In this network, a transistor 40 having an emitter electrode 42, a base electrode 43 and a collector electrode 44 has its collector electrode 44 connected to one terminal of the inductor 14. The emitter electrode 42 is connected to ground through a linearizing resistance 46.

Energizing current is supplied from the series combination of a source of energizing potential represented as a battery 48 and a load resistor 50 connected between the collector electrode 44 and ground. Signals which are in phase with the applied signal at the pair of input terminals 10 may be derived from a tap 52 from the inductor 14. These signals are coupled to the base electrode 43 through a resistor 54 and a capacitor 24 in series. A network for the application of variable bias current is connected to the base electrode 43. This network is the same as that described with reference to Figure 1.

Signals applied to the base electrode 43 are inverted in phase at the collector electrode 44. This is the essential difference between the circuit of Figure 1 and Figure 2. In the circuit of Figure 2, the phase reversal causes the voltage appearing across the inductor 14 to be relatively large when the gain of the transistor 40 is high. This voltage will be equal to the algebraic difference between the voltage applied to the pair of terminals 10 and the generated voltage, and is therefore greater in magnitude than the applied voltage.

The gain of the transistor 40 is subject to control by varying the base current which in turn varies the current flowing into the emitter electrode 42. The gain will tend to be increased when a current, which biases the base and emitter electrodes in a forward direction, is increased. On the other hand, the gain will be reduced if the current is reduced or reversed in direction.

A resistor 46 connected between the emitter electrode 42 and ground will tend to linearize the transistor characteristics. This resistor is included in order to keep the harmonic generation in the transistor to a low value when relatively large signals are applied at the pair of terminals 10.

The reactive current which flows through the inductor 14 will therefore be increased as the gain is increased. Under these conditions the resonant frequency of the tuned circuit will tend to rise. The Q of the circuit will be lowered by the current drawn by the base electrode 43. This loading may be reduced by use of a high value of resistance for the resistor 54. The range of resonant frequencies which may be obtained will be limited as the value of the resistor 54 is increased. The Q is also affected by the resistor 50 which should have low resistance in order to obtain high Q. When the resistance of the resisttor 50 is low the gain of the transistor 40 will then be low and the range of resonant frequencies is reduced. Thus, the Q which may be attained in the circuit is limited by the frequency range required. It is noted, however, that the frequency range which may be provided in this circuit is very large compared with circuits which have been utilized in the past.

Figure 3:
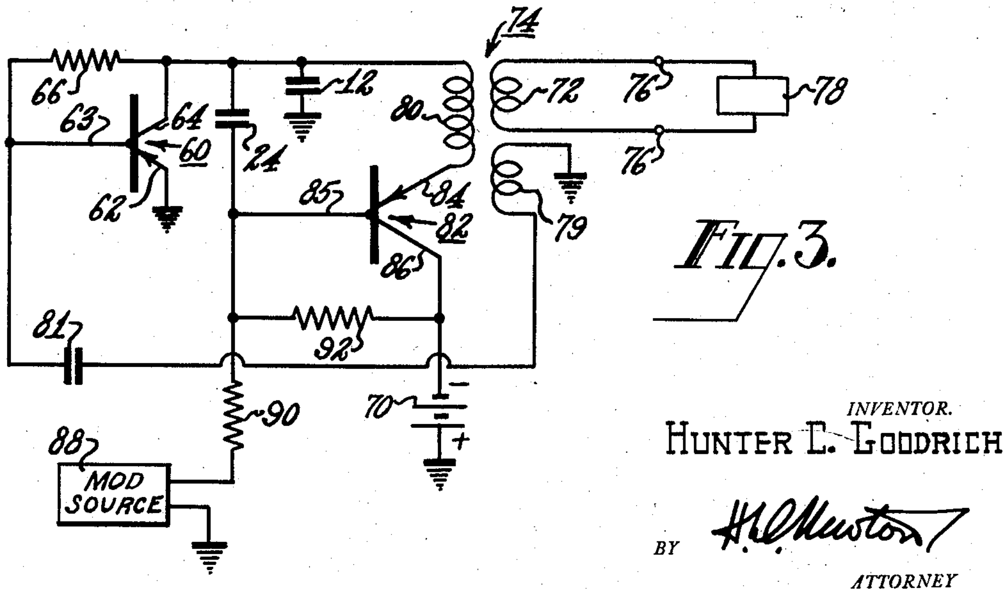
Figure 3 is a schematic circuit diagram of an oscillator utilizing the variable reactance circuit of the present invention in order to control or modulate the frequency of the oscillator.

In Figure 3, a transistor 60 having an emitter electrode 62 a base electrode 63 and a collector electrode 64 is connected as a feedback oscillator. Energizing current is supplied to the collector electrode 64 from a source of energizing potential represented in the drawing as a battery 70 having its positive terminal grounded and its negative terminal coupled through a D.-C. conductive circuit to the collector electrode 64. Bias current is supplied to the base electrode 63 by a resistor 66 which is connected between the collector electrode 64 and the base electrode 63. Output signals may be derived from a secondary winding on an output transformer 74. The secondary winding 72 is connected to a pair of output terminals 76 to which the utilization device 78 may be connected. A feedback winding 79 has one terminal connected to ground and the other terminal coupled through a capacitor 81 to the base electrode 63, and is properly phased to cause the transistor 69 to oscillate. The frequency of oscillation is determined by a resonant tuned circuit in accordance with the present invention.

This resonant circuit, which is coupled between the collector electrode 64 and ground, includes a capacitor 12 connected between the collector electrode 64 and ground, and the series combination of an inductive primary winding 80 of the transformer 74 and a transistor 82 having an emitter electrode 84 a base electrode 85 and a collector electrode 86. The inductive primary winding 80 is connected between the collector electrode 64 of the transistor 60 and the emitter electrode 84 of the transistor 82. The collector electrode 86 is connected to the negative terminal of the battery 70, whereby the D.-C. energizing current flows through the two transistors 82 and 60 in series. Signals appearing at the collector electrode 64 are coupled to the base electrode 85 through the capacitor 24 to provide operation of the reactance circuit in accordance with the present invention, as described with reference to Figure 1. A modulation source 88, which may be a generator of signals of relatively low frequency compared to those generated by the transistor 60, is coupled to the base electrode through an impedance element illustrated as a resistor 90. A resistor 92 is connected between the collector electrode 86 and the base electrode 85 provides base bias current for the proper operation of the transistor 82.

Signals from the modulation source 88 will cause the resonant frequency of the reactance circuit to vary in accordance with the present invention, thus causing the relatively high frequency generated by the transistor 60 to be frequency modulated.

The transistor variable reactance circuit which has been disclosed is capable of providing a resonant circuit whose frequency of resonance may be sensitively controlled over a broad frequency range by the application of a control or modulating signal. The circuit is relatively insensitive to variations in the characteristics of the transistor which is used.

What is claimed is:

1. In a variable reactance circuit having a pair of external circuit connections and providing a variable reactive component therebetween, the combination comprising a first reactive element, a transistor having base, emitter and collector electrodes, said emitter and collector electrodes defining a current carrying path, said first reactive elements and said current carrying path being connected in series relation between said pair of external circuit connections, a second reactive element of an opposite type connected between said external circuit connections and providing with said first reactive element a resonant circuit, means coupling said base electrode with the junction of said first reactive elements and one of said external circuit connections, means for applying a signal voltage to said external circuit connections; bias means connected with said electrodes, and means connected with said base electrode for applying a variable base electrode current for varying the signal voltage across said current carrying path whereby the reactive component between said external circuit connections is varied.

2. In a variable reactance circuit having a pair of external connections and providing a variable reactive component therebetween, the combination comprising a first reactive element, a transistor having base, emitter and collector electrodes, said emitter and collector electrodes defining a current carrying path, said first reactive element and said current carrying path being connected in series relation between said pair of external circuit connections, a second reactive elements of an opposite type connected between said external circuit connections and providing with said first reactive element a resonant circuit, a coupling capacitor connected between said base electrode and the junction of said first reactive element and one of said external circuit connections, means for applying a signal voltage to said external circuit connections; bias means connected with asid electrodes, and a source connected to apply a variable base electrode current for varying the gain of said transistor whereby the reactive component between said external circuit connections is varied.

3. In a variable reactance circuit having a pair of external circuit connections and providing a variable reactive component therebetween, the combination comprising a tapped reactive element, a transistor having base, emitter and collector electrodes, said emitter and collector electrodes defining a current carrying path, said reactive element and said current carrying path being connected in series relation between said pair of external circuit connections, a second reactive element of an opposite type connected between said external circuit connections and providing with said first reactive element a resonant circuit, means coupling said base electrode with said tap, bias means connected with said electrodes, and a source connected to apply a variable base electrode current for varying the signal voltage across said current carrying path whereby the reactive component between said external circuit connections is varied.

4. A variable reactance circuit as described in claim 3 wherein said tapped reactive element is an inductor and said second reactive element is a capacitor.

5. A variable reactance network, comprising in combination a pair of terminals one of which is connected to signal ground, a transistor having base, emitter and collector electrodes, an inductor connected between the other of said terminals and said emitter electrode, a capacitor connected between the other of said terminals and signal ground and providing with said inductor a resonant circuit, a source of energizing potential connected between said collecter electrode and said signal ground, a direct current conductive load element connected between said emitter electrode and said signal ground, a coupling capacitor connected between said other of the external circuit connections and said base electrode for applying signal information to said base electrode whereby a signal voltage is developed between said emitter electrode and said signal ground which is in phase with said signal information, said signal voltage and the voltage developed across said inductor being additive to provide a reactive impedance across said terminals, and means providing an adjustable source of bias current connected with said base electrode for adjusting the amplitude of said signal voltage to vary said reactive impedance.

6. In a variable reactance circuit having a pair of external connections and providing a variable reactive impedance therebetween, the combination comprising a transistor having base, emitter and collector electrodes, a first reactive impedance element coupled between one of said pair of external connections and one of said collector and emitter electrodes, means coupling the other of said pair of external circuit connections to the other of said collector and emitter electrodes, a second reactive element of an opposite type connected between said external circuit connections and providing with said first reactive element a resonant circuit, bias means for applying operating currents to said electrodes, means for applying an alternating signal voltage between said external connections, signal coupling means coupled between said base electrode and said external connections for providing an alternating voltage between said collector and emitter electrodes in response to said signal voltage which is substantially in phase therewith, and means providing a variable bias for said base electrode for varying the alternating voltage between said collector and emitter electrodes and for varying the reactive component between said external circuit connections.

7. A variable reactance circuit as defined in claim 6, wherein said first reactive impedance element is an inductor and said second relative impedance element is a capacitor.

8. In a variable reactance circuit having a pair of external circuit connections and providing a variable reactive component therebetween, the combination comprising a first reactive element of one type, a transistor having base, emitter, and collector electrodes, said emitter and collector electrodes defining a current carrying path, said reactive element and said current carrying path being connected in series relation between said pair of external circuit connections, a second reactive element of an opposite type connected between said external circuit connections and providing with said first reactive element and said current carrying path a parallel tuned circuit, a coupling capacitor connected between said base electrode and the junction of said first reactive element and one of said external circuit connections, means for applying a signal voltage to said external connections, bias means connected with said electrodes, and a source connected to apply a variable base electrode current to said transistor for varying the gain of said transistor and the resonant frequency of said tuned circuit.

References Cited in the file of this patent

UNITED STATES PATENTS

| | | |
|---|---|---|
| 2,570,939 | Goodrich | Oct. 9, 1951 |
| 2,585,078 | Barney | Feb. 12, 1952 |
| 2,623,102 | Schockley | Dec. 23, 1952 |
| 2,733,415 | Bangert | Jan. 31, 1956 |
| 2,750,456 | Waldhauer | June 12, 1956 |

UNITED STATES PATENT OFFICE

Certificate of Correction

Patent No. 2,870,421 January 20, 1959

Hunter C. Goodrich

It is hereby certified that error appears in the printed specification of the above numbered patent requiring correction and that the said Letters Patent should read as corrected below.

Column 1, line 59, for "cirsuit" read —circuit—; same line, for "for" read —or—; column 2, line 38, for "I" read —It—; column 5, line 66, for "elements" read —element—; column 6, line 1, before "connections" insert —circuit—; line 8, for "elements" read —element—; line 17, for "runt" read —rent—; column 7, line 13, for "relative" read —reactive—.

Signed and sealed this 28th day of April 1959.

[SEAL]

Attest:

T. B. MORROW, ROBERT C. WATSON,

*Attesting Officer.* *Commissioner of Patents.*